(12) United States Patent
Eom et al.

(10) Patent No.: US 12,021,515 B2
(45) Date of Patent: Jun. 25, 2024

(54) SEMICONDUCTOR CHIP INCLUDING CHIP PADS OF DIFFERENT SURFACE AREAS, AND SEMICONDUCTOR PACKAGE INCLUDING THE SEMICONDUCTOR CHIP

(71) Applicant: SK hynix Inc., Icheon-si Gyeonggi-do (KR)

(72) Inventors: Ju Il Eom, Icheon-si Gyeonggi-do (KR); Woo Jin Lee, Icheon-si Gyeonggi-do (KR); Hyung Ho Cho, Icheon-si Gyeonggi-do (KR)

(73) Assignee: SK hynix Inc., Icheon-si (KR)

(*) Notice: Subject to any disclaimer, the term of this patent is extended or adjusted under 35 U.S.C. 154(b) by 248 days.

(21) Appl. No.: 17/498,080

(22) Filed: Oct. 11, 2021

(65) Prior Publication Data

US 2022/0173735 A1 Jun. 2, 2022

(30) Foreign Application Priority Data

Nov. 30, 2020 (KR) .......................... 10-2020-0165149
Mar. 18, 2021 (KR) .......................... 10-2021-0035578

(51) Int. Cl.
*H03K 17/687* (2006.01)
*H01L 23/00* (2006.01)
*H01L 23/485* (2006.01)
*H01L 23/498* (2006.01)
*H01L 27/092* (2006.01)

(52) U.S. Cl.
CPC ......... *H03K 17/687* (2013.01); *H01L 23/485* (2013.01); *H01L 23/49827* (2013.01); *H01L 23/49838* (2013.01); *H01L 24/06* (2013.01); *H01L 27/0925* (2013.01); *H01L 24/16* (2013.01); *H01L 2224/05569* (2013.01); *H01L 2224/0603* (2013.01); *H01L 2224/16227* (2013.01)

(58) Field of Classification Search
CPC ................ H03K 17/687; H01L 23/485; H01L 23/49827; H01L 23/49838; H01L 24/06; H01L 27/0925; H01L 24/16; H01L 2224/05569

See application file for complete search history.

(56) References Cited

U.S. PATENT DOCUMENTS 7,400,134 B2 * 7/2008 Morishita ........ G01R 31/31723
257/777
7,518,242 B2 4/2009 Hirai
(Continued)

FOREIGN PATENT DOCUMENTS

KR 1020080068346 A 7/2008

*Primary Examiner* — Mary A Wilczewski
*Assistant Examiner* — Jaesun Lee
(74) *Attorney, Agent, or Firm* — WILLIAM PARK & ASSOCIATES LTD.

(57) ABSTRACT

A semiconductor chip includes a chip body including a signal input/output circuit, a chip pad structure disposed on a surface of the chip body, the chip pad structure including first and second chip pads, the two chip pads having different surface areas, and a chip pad selection circuit disposed in the chip body and electrically connected to the signal input/output circuit and the chip pad structure. The chip pad selection circuit is configured to selectively and electrically connect one of the first and second chip pads to the signal input/output circuit.

16 Claims, 11 Drawing Sheets

(56) References Cited

U.S. PATENT DOCUMENTS

| | | | |
|---|---|---|---|
| 8,097,490 B1* | 1/2012 | Pagaila | H01L 23/5386 |
| | | | 438/618 |
| 2012/0038053 A1* | 2/2012 | Oh | H01L 21/561 |
| | | | 257/773 |
| 2016/0343635 A1* | 11/2016 | Rae | H01L 21/4846 |
| 2019/0067124 A1* | 2/2019 | Tsai | H01L 21/3115 |
| 2020/0176406 A1* | 6/2020 | Lee | H01L 23/49838 |
| 2020/0176407 A1* | 6/2020 | Lee | H01L 23/49838 |

* cited by examiner

SEMICONDUCTOR CHIP INCLUDING CHIP PADS OF DIFFERENT SURFACE AREAS, AND SEMICONDUCTOR PACKAGE INCLUDING THE SEMICONDUCTOR CHIP

CROSS-REFERENCE TO RELATED APPLICATIONS

The present application claims priority under 35 U.S.C. 119(a) to Korean Applications No. 10-2020-0165149, filed on Nov. 30, 2020 and No. 10-2021-0035578, filed on Mar. 18, 2021, which are incorporated herein by references in their entirety.

BACKGROUND

1. Technical Field

The present disclosure generally relates to packaging technology and, more particularly, to semiconductor chips including chip pads of different surface areas and semiconductor packages including the same.

2. Related Art

Today, the semiconductor industry is evolving in a direction of manufacturing lightweight, compact, high-speed, multi-functional, high-performance, and highly reliable semiconductor products at low cost, and semiconductor packaging technology is an important part in achieving this. Semiconductor packaging technology refers to a technology for mounting a semiconductor chip with a circuit part formed through wafer processes on a package substrate, securing an electrical connection between the semiconductor chip and an external electronic device through the package substrate, protecting the semiconductor chip from an external environment, and the like. The technology for mounting a semiconductor chip on a package substrate includes a method of wire bonding the semiconductor chip and the package substrate, a method of flip-chip bonding the semiconductor chip and the package substrate, and the like.

SUMMARY

A semiconductor chip according to an embodiment of the present disclosure may include a chip body including a signal input/output circuit, a chip pad structure disposed on a surface of the chip body, the chip pad structure including an input/output pad unit and a control pad unit, and a chip pad selection circuit disposed in the chip body and electrically connected to the signal input/output circuit and the chip pad structure. The input/output pad unit includes first and second chip pads, the first and second chip pads having different surface areas. The chip pad selection circuit is configured to select one of the first and second chip pads and configured to electrically connect one of the first and second chip pads to the signal input/output circuit based on a control signal that is input from the control pad unit.

A semiconductor package according to another embodiment of the present disclosure may include a package substrate, and a semiconductor chip disposed on the package substrate. The package substrate includes a substrate body, and a plurality of chip connection pads that are disposed on a surface of the substrate body. The semiconductor chip includes a chip body, and a chip pad structure disposed on a surface of the chip body and including a plurality of input/output pad units and at least one control pad unit. The plurality of input/output pad units and the at least one control pad unit are disposed to respectively correspond to the plurality of chip connection pads. Each of the plurality of input/output pad units includes first and second chip pads that are disposed to be spaced apart from each other, the first and second chip pads having different surface areas. One chip pad of the first and second chip pads is electrically connected to the corresponding chip connection pad among the plurality of chip connection pads.

DETAILED DESCRIPTION

Figure 1:
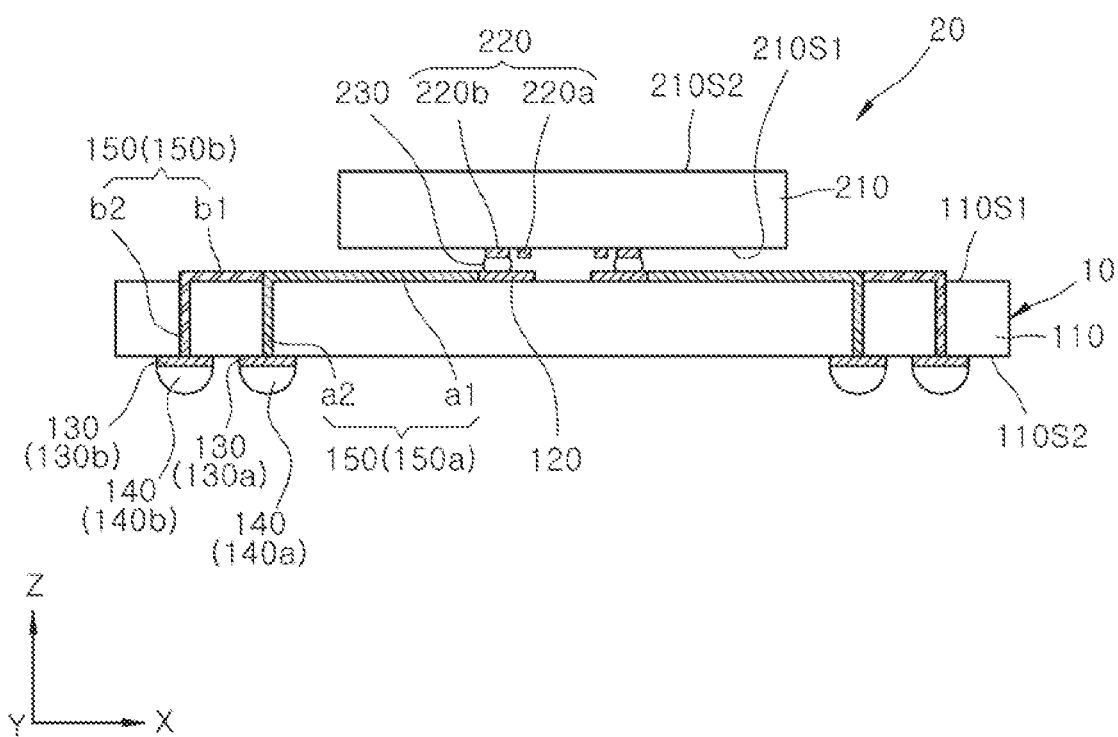
FIG. 1 is a cross-sectional view schematically illustrating a semiconductor package according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise," "include," or "have"

are intended to specify the presence of a feature, a number, a step, an operation, a component, an element, a part, or combinations thereof, but not used to preclude the presence or possibility of adding one or more other features, numbers, steps, operations, components, elements, parts, or combinations thereof.

In this specification, the phrase "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

In this specification, bonding between one element and another element may include indirect bonding through an intermediate material interposed between the one element and the other element, in addition to direct bonding of the one element to the other element. As an example, bonding between a chip connection pad of a package substrate and a chip pad of a semiconductor chip may mean not only that the chip connection pad and the chip pad are directly bonded, but also that a bonding material such as a bump or a solder material is interposed between the chip connection pad and the chip pad so that the chip connection pad and the chip pad are bonded to each other.

FIG. 1 is a cross-sectional view schematically illustrating a semiconductor package 1 according to an embodiment of the present disclosure. Referring to FIG. 1, the semiconductor package 1 may include a package substrate 10 and a semiconductor chip 20 disposed on the package substrate 10. The package substrate 10 and the semiconductor chip 20 may be bonded to each other by conductive connectors 230. The conductive connector 230 may include a bump, for example.

The package substrate 10 may include a substrate body 110 with an upper surface 110S1 and a lower surface 110S2. The package substrate 10 may include chip connection pads 120 that are disposed on the upper surface 110S1 of the substrate body 110. The package substrate 10 may include a plurality of connection pads 130 that are disposed to be spaced apart from the chip connection pads 120 in a first direction and a second direction (e.g., x-direction and z-direction). In the embodiment, the plurality of connection pads 130 may be disposed on the lower surface 110S2 of the substrate body 110. The package substrate 10 may include a plurality of connection structures 140 respectively disposed on the plurality of connection pads 130. The plurality of connection structures 140 may include, for example, bumps or solder balls. The plurality of connection structures 140 may be configured to be electrically connected to other semiconductor packages or other electronic systems, for example.

Although not illustrated in FIG. 1, in an embodiment, the chip connection pads 120 may be arranged on the upper surface 110S1 of the substrate body 110 along a third direction (e.g., y-direction). The arrangement of the plurality of chip connection pads 120 will be described later with reference to FIG. 2. In addition, the connection pads 130 may be arranged on the lower surface 110S2 of the substrate body 110 along the third direction (e.g., y-direction). The arrangement of the plurality of connection pads 130 will be described later with reference to FIG. 2. Hereinafter, for the convenience of description, when two different connection pads that are distinguished from each other are selected among the plurality of connection pads 130, the selected two connection pads are referred to as a first connection pad 130a and a second connection pad 130b, respectively. In this case, among the plurality of connection structures 140, the connection structure in contact with the first connection pad 130a may be referred to as a first connection structure 140a, and the connection structure in contact with the second connection pad 130b may be referred to as a second connection structure 140b.

Referring to FIG. 1, a plurality of wirings 150 may be disposed on/in the substrate body 110. The first wirings 150a among the plurality of wirings 150 may electrically connect the first connection structures 140a to the corresponding chip connection pads 120. The second wirings 150b among the plurality of wirings 150 may electrically connect the second connection structures 140b to other chip connection pads 120 (not illustrated in FIG. 1).

In an embodiment, the first wiring 150a and the second wiring 150b may have different lengths. Accordingly, when electrical signals are transferred along the first and second wirings 150a and 150b, different parasitic capacitances may be generated in the first and second wirings 150a and 150b due to the difference in the lengths of the wirings. Referring to FIG. 1, the first wiring 150a may include a first outer layer circuit a1 and a first via a2. The second wiring 150b may include a second outer layer circuit b1 and a second via b2. The first and second outer layer circuits a1 and b1 may be disposed on the upper surface 110S1 of the substrate body 110. The first and second vias a2 and b2 may be disposed in the substrate body 110 to connect the first and second outer layer circuits a1 and b1 to the corresponding first and second connection pads 130a and 130b, respectively. The first and second outer layer circuits a1 and b1 may have various shapes and lengths. The first and second vias a2 and b2 may be formed to have substantially the same shape and length.

In an embodiment, as illustrated in FIG. 1, the first outer layer circuit a1 of the first wiring 150a and the second outer layer circuit b1 of the second wiring 150b may have different lengths on an electrical signal path. Accordingly, when electrical signals are transferred along the first and second outer layer circuits a1 and b1, different parasitic capacitances may be generated along the first and second outer layer circuits a1 and b1, based on the different lengths.

In some embodiments, not illustrated in FIG. 1, a configuration of the plurality of wirings 150 may be variously modified. As an example, each of the plurality of wirings 150 may further include at least one inner layer circuit inside the substrate body 110. The at least one inner layer circuit may be electrically connected to the outer layer circuits and the connection pads through at least one via. In this case, based on the sum of the lengths of the outer layer circuit and the inner layer circuit, the magnitude of the parasitic capacitance that is generated in each of the plurality of wirings 150 may vary.

Referring to FIG. 1, the semiconductor chip 20 may include a chip body 210 with a first surface 210S1 and a second surface 210S2, and chip pad units 220 disposed on the first surface 210S1. The chip body 210 may include an internal integrated circuit. In an embodiment, the internal integrated circuit may be disposed in an inner region of the chip body 210. Although not illustrated in FIG. 1, the chip body 210 may include a signal input/output circuit electrically connected to the internal integrated circuit. The electrical signals processed in the internal integrated circuit may pass through the signal input/output circuit to reach the chip pad units 220. In addition, the electrical signals that are input through the chip pad units 220 may pass through the signal input/output circuit to be transferred to the internal integrated circuit. The electrical signal transmission between the signal input/output circuit and the chip pad units 220 will be described later with reference to FIG. 5.

The chip pad units 220 may be disposed to correspond to the chip connection pads 120 on the first surface 210S1. Each of the chip pad units 220 may include a first chip pad 220a and a second chip pad 220b that are disposed to be spaced apart from each other. The first chip pad 220a may have a different surface area compared to the second chip pad 220b, both formed on the first surface 210S1. One of the first and second chip pads 220a and 220b may be bonded to the corresponding chip connection pad 120. The bonding may be achieved by a conductive connector 230. A method of determining the one chip pad of the first and second chip pads 220a and 220b to be bonded to the chip connection pad 120 will be described later with reference to FIG. 6.

The one chip pad of the first and second chip pads 220a and 220b to be bonded to the chip connection pad 120 may function as a bonding pad. The signal input/output circuit may be electrically connected to the chip connection pad 120 through the bonding pad. Referring to FIG. 1, the second chip pad 220b may function as the bonding pad. The other chip pad that is not to be bonded to the chip connection pad 120 between the first and second chip pads 220a and 220b may function as a chip test pad. The chip test pad may be used as a pad for connecting a test device for testing the operation of the internal integrated circuit of the semiconductor chip 20 to the internal integrated circuit. In an embodiment, the operation test that uses the chip test pad may be performed with respect to the semiconductor chip 20 before the semiconductor chip 20 is mounted on the package substrate 10.

Although not illustrated in FIG. 1, a chip pad selection circuit that is connected to the first and second chip pads 220a and 220b and the signal input/output circuit may be disposed in the chip body. The chip pad selection circuit may be configured to selectively and electrically connect one of the bonding pad and the chip test pad to the signal input/output circuit. A detailed configuration of the chip pad selection circuit will be described later with reference to FIG. 5.

Although not illustrated in FIG. 1, the chip pad units 220 may be arranged on the first surface 210S1 of the chip body 210 along the third direction (e.g., y-direction) in plurality. Each of the first and second chip pads 220a and 220b may be disposed along the third direction. The arrangement of the plurality of chip pad units 220 will be described later with reference to FIG. 3.

Figure 2:
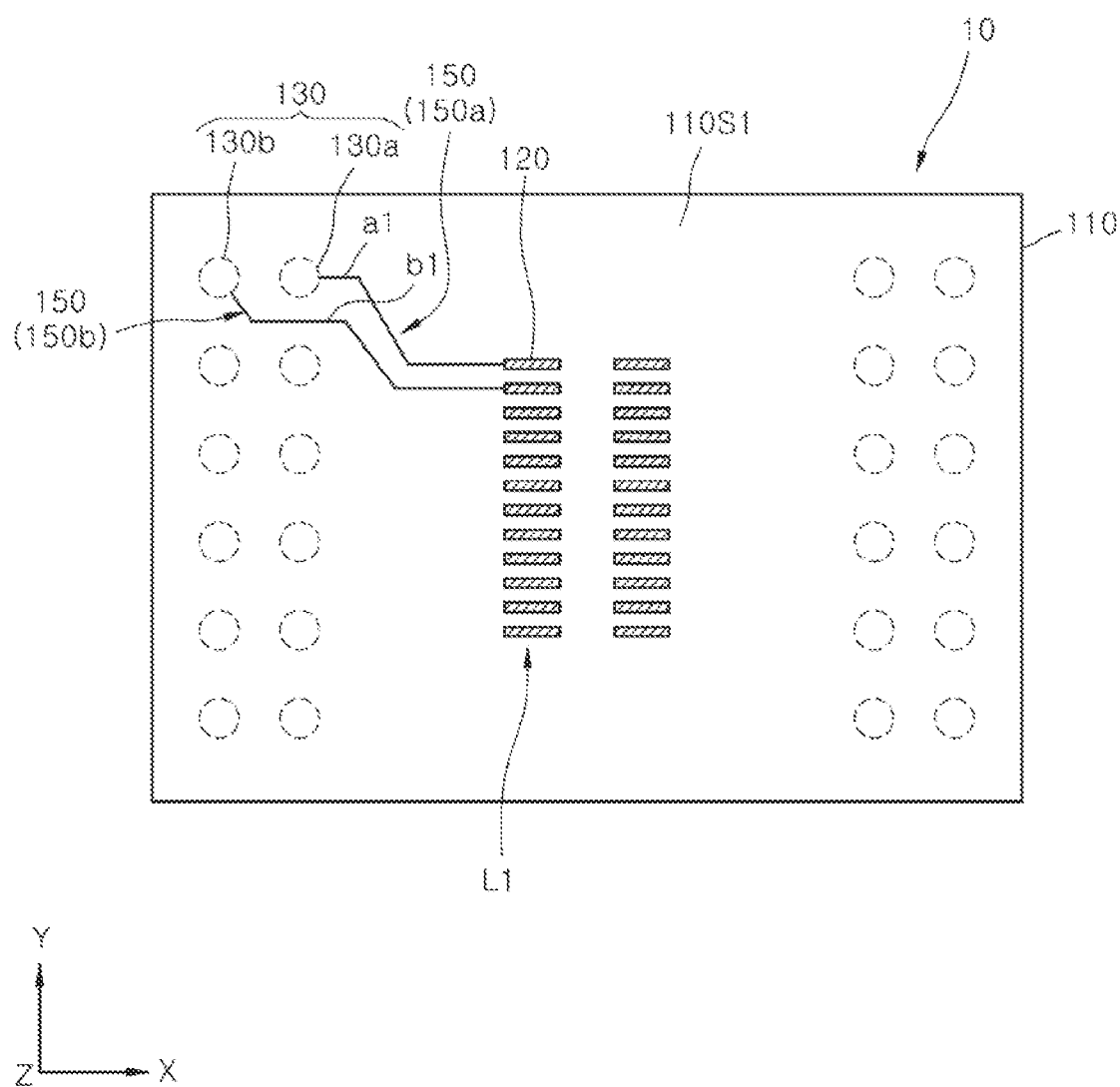
FIG. 2 is a plan view schematically illustrating a package substrate according to an embodiment of the present disclosure.

FIG. 2 is a plan view schematically illustrating a package substrate according to an embodiment of the present disclosure. FIG. 2 may be a plan view of the package substrate 10 of the semiconductor package 1 illustrated in FIG. 1.

Referring to FIG. 2, a plurality of chip connection pads 120 may be disposed on an upper surface 110S1 of a substrate body 110. A plurality of chip connection pads 120 may be disposed to be spaced apart from each other on the upper surface 110S1 of the substrate body 110 along the third direction (e.g., y-direction). In an embodiment, the plurality of chip connection pads 120 may be disposed to form columns L1. In addition, in an embodiment, the plurality of chip connection pads 120 may be arranged in two columns L1, parallel to each other in the y-direction. A plurality of connection pads 130 may be disposed on a lower surface 110S2 of the substrate body 110. Although not illustrated in FIG. 2, the connection structures 140 of FIG. 1 may be respectively disposed on the corresponding connection pads 130. As an example, as illustrated in FIG. 1, first and second connection pads 130a and 130b may be disposed to be adjacent to each other in an x-direction on the lower surface 110S2 of the substrate body 110. First connection structures 140a may be disposed on the corresponding first connection pads 130a, and second connection structures 140b may be disposed on the corresponding second connection pads 130b.

Referring to FIGS. 1 and 2 together, in an embodiment, each of the first connection structures 140a may be electrically connected to the corresponding one chip connection pad among the plurality of chip connection pads 120 through a first wiring 150a through the first connection pad 130a. Each of the second connection structures 140b may be electrically connected to the corresponding another chip connection pad among the plurality of chip connection pads 120 by the second wiring 150b through the second connection pad 130b. The one chip connection pad and another chip connection pad may be disposed to be adjacent to each other in the y-direction. The first and second wirings 150a and 150b may have corresponding first and second outer layer circuits a1 and b1, respectively. In this case, the first and second outer layer circuits a1 and b1 may have different lengths on the electrical signal path.

Meanwhile, as illustrated in FIGS. 1 and 2, the first connection pad 130a and the second connection pad 130b may be disposed to be adjacent to each other in the x-direction on the lower surface 110S2 of the substrate body 110, so that the connection structure 140a and the second connection structure 140b may be disposed to be adjacent to each other in the x-direction. However, the present invention is not limited thereto, the first connection pad 130a and the second connection pad 130b might not be disposed to be adjacent to each other on the lower surface 110S of the substrate body 110. As an example, the first connection pad 130a and the second connection pad 130b may be disposed so as not to face each other in the x-direction or the y-direction on the lower surface 110S of the substrate body 110. Accordingly, the first connection structure 140a and the second connection structure 140b might not be disposed to be adjacent to each other. A configuration of the first and second connection pads 130a and 130b may be determined by a design configuration of the package substrate 10. The design configuration may include various arrangement configurations for the connection pads 130, the connection structures 140, and the wirings 150, as an example, depending on the function and use of the semiconductor package.

Referring to FIGS. 1 and 2 together, a plurality of wirings 150 may be disposed from the plurality of connection structures 140 to the corresponding chip connection pads 120. In FIG. 2, a first wiring 150a and a second wiring 150b are illustrated as an example of the plurality of wirings 150 for the convenience of description. Although not illustrated, the wirings other than the first and second wirings 150a and 150b may be respectively disposed between the corresponding connection structures 140 and the chip connection pads 120. In this case, the lengths of the plurality of wirings 150 may be different from each other. In this case, as the length of the wiring 150 is shorter, the parasitic capacitance of the semiconductor package 1 that is generated by the wirings 150 in the substrate body 110 may decrease during an electrical signal transmission process.

In an embodiment, referring to FIG. 2, the length of the first wiring 150a with the first outer layer circuit a1 may be shorter than the length of the second wiring 150b with the second outer layer circuit b1. In this case, the parasitic capacitance that is generated by the first wirings 150a may be smaller than the parasitic capacitance that is generated by the second wirings 150b. Hereinafter, the parasitic capacitance that is generated by the wirings, described above, will be referred to as a "package parasitic capacitance."

In an embodiment of the present disclosure, a configuration is provided to compensate for the difference in the package parasitic capacitance that is generated for each of the plurality of chip connection pads 120 (or for each of the plurality of connection structures 140) on the electrical signal path of the package substrate 10 due to the difference in lengths of the plurality of wirings 150. As described below, when two different chip connection pads 120 that are respectively connected to the first wiring 150a and the second wiring 150b of different lengths are disposed on the upper surface 110S1 of the substrate body 110, the two different chip connection pads 120 may be connected to each other in correspondence with first and second chip pads 220a and 220b with different surface areas, so that the above-described difference in the package parasitic capacitance may be offset.

Figure 3:
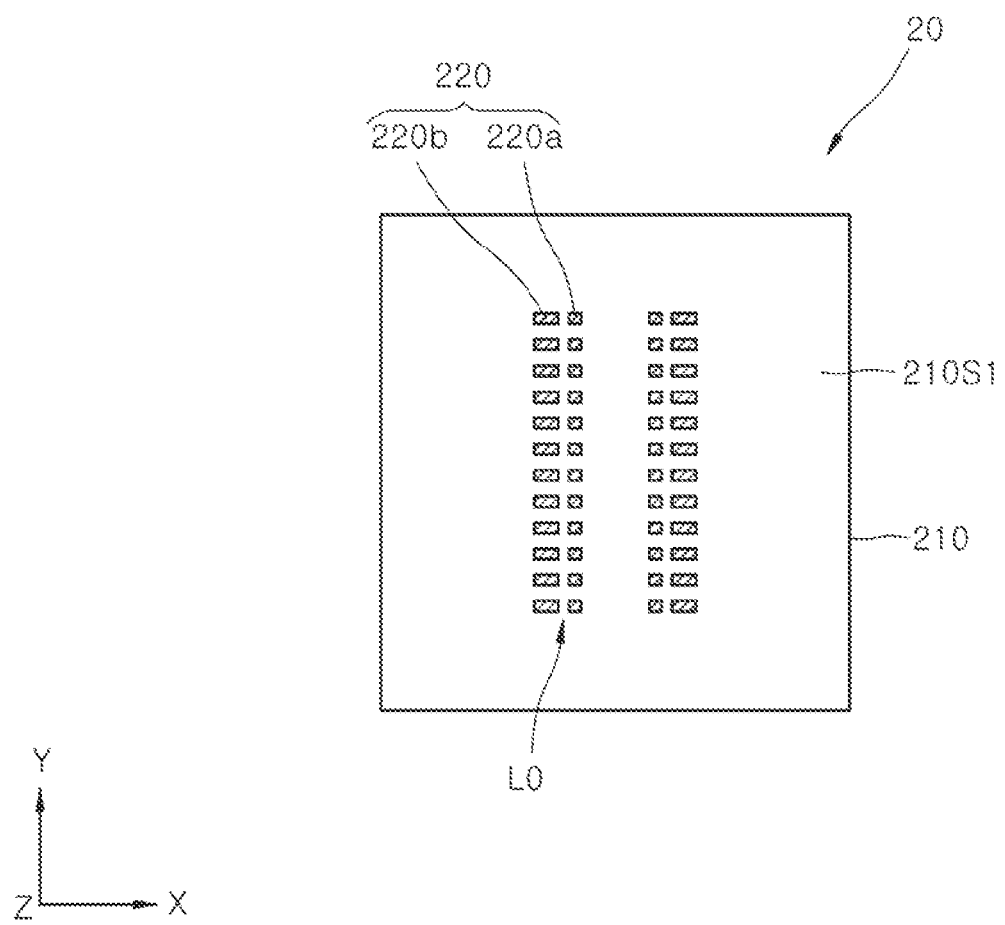
FIG. 3 is a plan view schematically illustrating a semiconductor chip according to an embodiment of the present disclosure.

FIG. 3 is a plan view schematically illustrating a semiconductor chip according to an embodiment of the present disclosure. FIG. 3 may be a plan view of the semiconductor chip 20 of the semiconductor package 1 illustrated in FIG. 1.

Referring to FIG. 3, a plurality of chip pad units 220 may be disposed on a first surface 210S1 of a chip body 210. The plurality of chip pad units 220 may be disposed to be spaced apart from each other along the third direction (e.g., y-direction). In the embodiment, the plurality of chip pad units 220 may be disposed to form columns L0. In addition, in the embodiment, the plurality of chip pad units 220 may be arranged in two columns L0, parallel to each other in the y-direction.

Each of the plurality of chip pad units 220 may include first and second chip pads 220a and 220b that are disposed to be spaced apart from each other in the x-direction. The first chip pad 220a may have a different surface area compared to the second chip pad 220b. In an embodiment, the first chip pad 220a may have a smaller surface area than the second chip pad 220b.

Referring to FIG. 3, the plurality of first chip pads 220a may be disposed to form a column along the y-direction. The plurality of second chip pads 220b may be disposed to be spaced apart from the plurality of first chip pads 220a and to form a column L0 along the y-direction.

Figure 4:
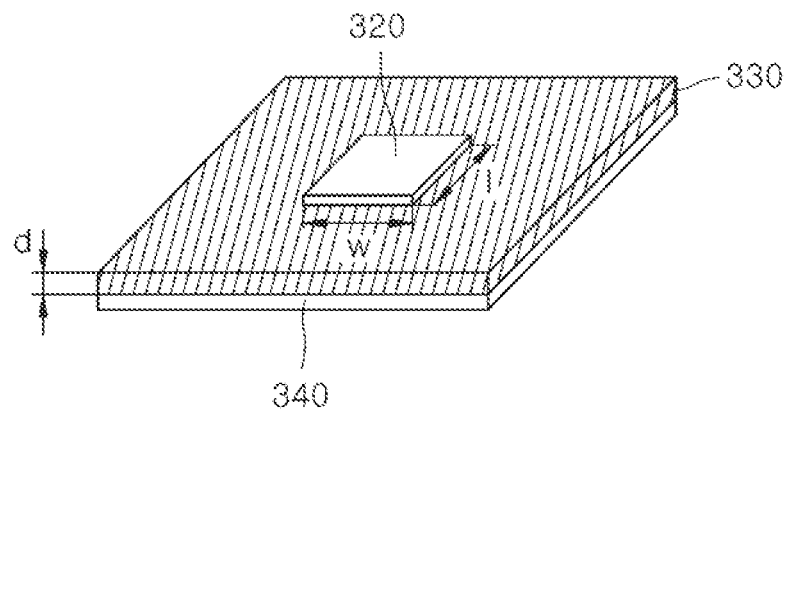
FIG. 4 is a view schematically illustrating a parasitic capacitance that is generated by a chip pad of a semiconductor chip according to an embodiment of the present disclosure.

FIG. 4 is a view schematically illustrating a parasitic capacitance that is generated by a chip pad of a semiconductor chip according to an embodiment of the present disclosure. FIG. 4 schematically illustrates a chip pad 320, an inner circuit layer 340, and an interlayer dielectric layer 330 disposed on a surface of a semiconductor chip.

The chip pad 320 and the inner circuit layer 340 may be conductive layers, and the interlayer dielectric layer 330 may be interposed between the chip pad 320 and the inner circuit layer 340. The parasitic capacitance that is generated between the chip pad 320 and the inner circuit layer 340 may be proportional to the dielectric constant of the interlayer dielectric layer 330 and the surface area w*I of the chip pad 320, and the parasitic capacitance that is generated between the chip pad 320 and the inner circuit layer 340 may be inversely proportional to the thickness 'd' of the interlayer dielectric layer 330. Accordingly, as the surface area of the chip pad 320 decreases, the parasitic capacitance that is generated between the chip pad 320 and the internal circuit layer 340 may decrease. Hereinafter, the parasitic capacitance that is generated between the chip pad 320 and the inner circuit layer 340 in the semiconductor chip is referred to as "pad parasitic capacitance."

Referring to FIGS. 3 and 4 together, when a chip pad with a smaller surface area between the first and second chip pads 220a and 220b is electrically connected to the corresponding chip connection pad 120, the pad parasitic capacitance of the semiconductor chip 20 in the semiconductor package 1 may be relatively small. On the other hand, when a chip pad with a larger surface area between the first and second chip pads 220a and 220b is connected to the corresponding chip connection pad 120, the pad parasitic capacitance of the semiconductor chip 20 in the semiconductor package 1 may be relatively large. That is, each of the first and second chip pads 220a and 220b of the semiconductor chip 20 may have a pad parasitic capacitance that is proportional to the surface area.

Figure 5:
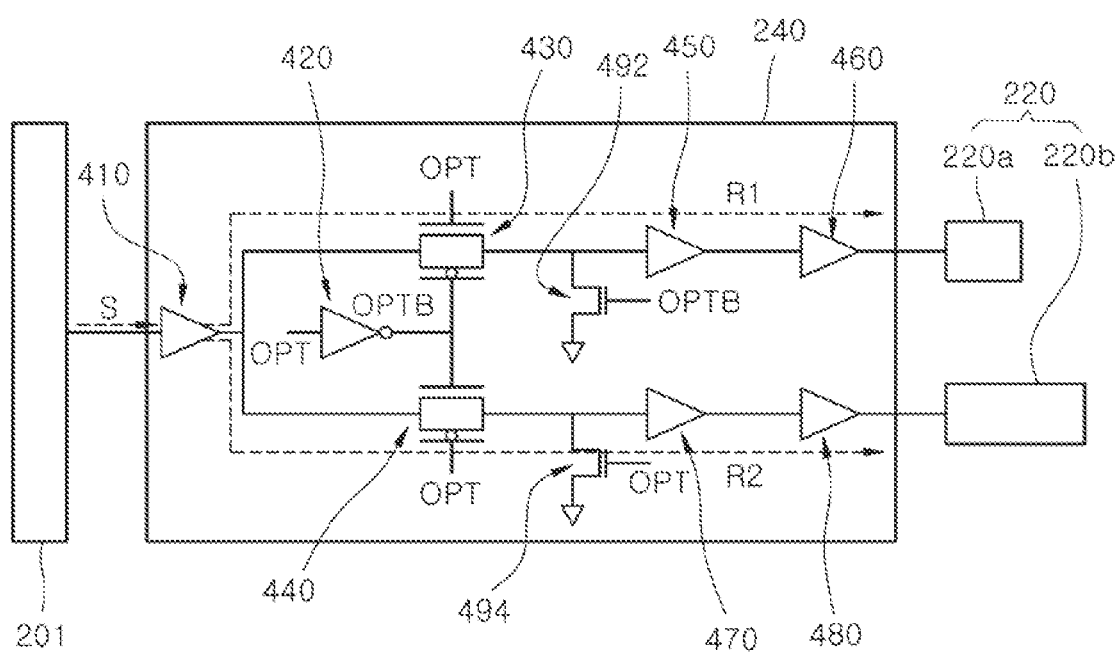
FIG. 5 is a circuit diagram of a chip pad selection circuit of a semiconductor chip according to an embodiment of the present disclosure.

FIG. 5 is a circuit diagram of a chip pad selection circuit of a semiconductor chip according to an embodiment of the present disclosure. The chip pad selection circuit 240 may be disposed in the semiconductor chip 20 of the semiconductor package 1 of FIGS. 1 and 3.

The chip pad selection circuit 240, illustrated in FIG. 5, may be connected to a signal input/output circuit 201 and a chip pad unit 220 in a chip body 210. In an embodiment, the chip pad selection circuit 240 may be disposed between the signal input/output circuit 201 and the chip pad unit 220 of the chip body 210. The chip pad selection circuit 240 may be disposed in the chip body 210. The chip pad selection circuit 240 may be disposed to correspond to each of the plurality of chip pad units 220.

The chip pad selection circuit 240 may be configured to select the one chip pad between the first and second chip pads 220a and 220b and electrically connect the selected one chip pad to the signal input/output selection circuit 201. As an example, the chip pad selection circuit 240 may be configured to electrically connect one of the first and second chip pads 220a and 220b to the signal input/output selection circuit 201 and electrically open the other chip pad of the first and second chip pads 220a and 220b from the signal input/output selection circuit 201. In an embodiment, when performing electrical test for an internal integrated circuit, the chip pad selection circuit 240 may provide one of the first and second chip pads 220a and 220b as a chip test pad through the electrical connection. When electrically connecting the internal integrated circuit to the package substrate, the chip pad selection circuit 240 may provide the other pad of the first and second chip pads 220a and 220b as a bonding pad through the electrical connection.

Hereinafter, an operation method of the chip pad selection circuit 240 will be schematically described with reference to FIG. 5. First, signal information S transferred from the signal input/output circuit 201 electrically connected to the internal integrated circuit is input to an input buffer 410. The input buffer 410 transfers the signal information S to first and second transfer transistors 430 and 440. At this time, a separate control signal OPT may be input to an input terminal of an inverter 420 connected to the first and second transfer transistors 430 and 440.

When the control signal OPT is a signal of a 'high' level, an inversion control signal OPTB that is output from the inverter may turn on the first transfer transistor 430, and the signal information S may be output to the first chip pad 220a through first and second buffers 450 and 460. The transfer of the signal information is illustrated as a first signal path R1. In this case, a first transistor 492 for preventing a malfunction of signal transfer may be disposed on the first signal path R1. The first transistor 492 may be controlled by the inversion control signal OPTB.

Meanwhile, when the control signal OPT is a signal of a 'low' level, the inversion control signal OPTB that is output from the inverter 420 may turn on the second transfer transistor 440, and the signal information S may be output to the second chip pad 220b through third and fourth buffers 470 and 480. The transfer of the signal information S is illustrated as a second signal path R2. In this case, a second transistor 494 for preventing a malfunction of signal transfer may be disposed on the second signal path R2. The second transistor 494 may be controlled by the control signal OPT.

Referring to FIG. 5 again, one of the first and second chip pads 220a and 220b may function as a bonding pad. That is, one of the first and second chip pads 220a and 220b may be bonded to the corresponding chip connection pad 120 of the substrate body 110 of FIGS. 1 and 2. The other of the first and second chip pads 220a and 220b may function as a chip test pad. The chip test pad may function as a pad through which a test device for testing the semiconductor chip 20 is electrically connected to the internal integrated circuit of the semiconductor chip 20.

In an embodiment, the chip pad selection circuit 240 may electrically connect the signal input/output circuit 201 to the chip test pad during testing the semiconductor chip 20 using the test device. In this case, the signal input/output circuit 201 and the bonding pad may maintain the electrically open state. After bonding the semiconductor chip 20 on which the test is completed to the package substrate 10, the chip pad selection circuit 240 may electrically connect the signal input/output circuit 201 to the bonding pad and may electrically open the signal input/output circuit 201 from the chip test pad. Accordingly, after the semiconductor package 1 is completed, the internal integrated circuit may maintain an electrically connected state to the bonding pad and may maintain an electrically open state from chip the test pad.

In an embodiment of the present disclosure, the references for selecting the bonding pad and the chip test pad between the first and second chip pads 220a and 220b may be lengths of the wirings that reach the corresponding connection structures from the chip connection pad 120 of the package substrate 10 that overlaps with the first and second chip pads 220a and 220b, as described below in connection with FIG. 6.

Figure 6:
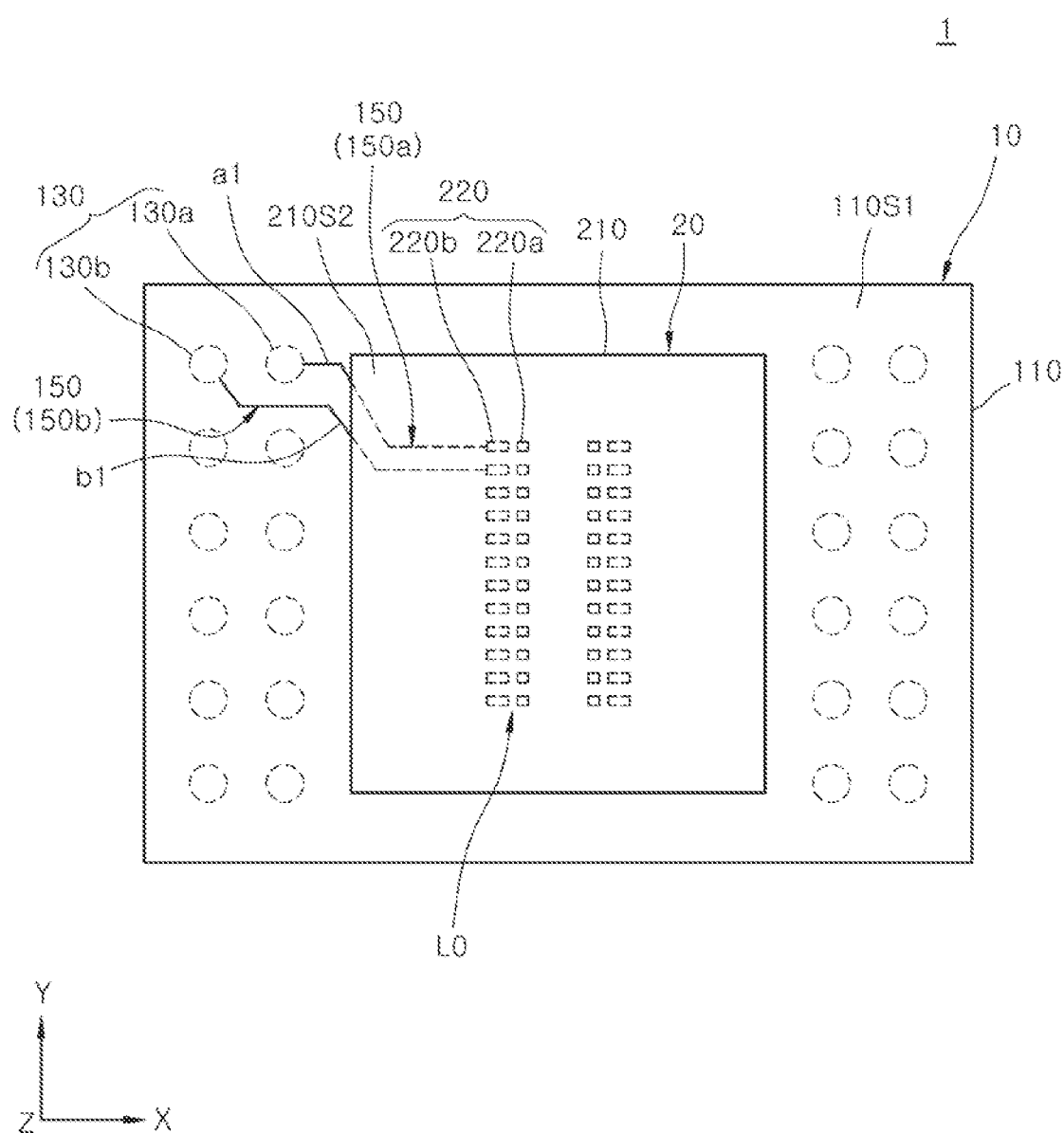
FIG. 6 is a plan view schematically illustrating a semiconductor package according to an embodiment of the present disclosure.

FIG. 6 is a plan view of a semiconductor package according to an embodiment of the present disclosure. FIG. 6 may be a view in which the semiconductor chip 20 of FIG. 3 is mounted on the upper surface 110S1 of the package substrate 10 of FIG. 2. In addition, FIG. 6 may be a plan view of the semiconductor package 1 illustrated in FIG. 1.

Referring to FIGS. 1, 2, and 6, a plurality of chip pad units 220 on a first surface 210S1 of the semiconductor chip 20 may be disposed to face and overlap with a plurality of chip connection pads 120 on an upper surface 110S1 of a semiconductor substrate 10. Each of the plurality of chip pad units 220 may include a first chip pad 220a and a second chip pad 220b that are disposed to be spaced apart from each other in the x-direction and may have different surface areas. Referring to FIG. 6, in an embodiment, the first chip pad 220a may have a smaller surface area than the second chip pad 220b. Referring to FIGS. 1, 2, and 6, in each of the plurality of chip pad units 220, the first and second chip pads 220a and 220b may be disposed to overlap with the corresponding chip connection pad 120.

In an embodiment, with respect to each of the plurality chip pad units 220, the chip connection pad 120 that overlaps with one chip pad unit 220 may be electrically connected to a connection structure 140 through a wiring 150. In this case, depending on the length of the wiring 150 that connects the connection structure 140 to the chip connection pad 120, the bonding pad to be bonded to the chip connection pad 120 may be determined between the first and second chip pads 220a and 220b of the chip pad unit 220. In addition, when one of the first and second chip pads 220a and 220b is determined as the bonding pad, the other chip pad may be determined as a chip test pad. The process of determining the bonding pad and the chip test pad may be performed before the semiconductor chip 20 is mounted on the package substrate 10. In an embodiment, the operation test for the internal integrated circuit of the semiconductor chip 20 may be performed by using the determined chip test pad, and then, when the semiconductor chip 20 is mounted on the package substrate 10, the bonding pad may be bonded to the chip connection pad 120 of the package substrate 10.

In an embodiment, referring to FIGS. 1, 2, and 6 together, two connection structures 140a and 140b may be selected from the plurality of connection structures 140. In an embodiment, the method of selecting the two connection structures 140a and 140b may be determined by the design configuration of the package substrate 10. The design configuration may include various arrangement configurations for the connection pads 130, the connection structures 140, and the wirings 150 according to the function and use of the semiconductor package, for example. In an embodiment, as illustrated in FIGS. 1, 2, and 6, two connection structures 140a and 140b and two connection pads 130a and 130b adjacent to each other along the x-direction may be selected. In addition, two chip connection pads 120 electrically connected to the two connection pads 130a and 130b through the wirings 150 may be determined.

The first connection structure 140a, between the two connection structures 140a and 140b, may be connected to one corresponding chip connection pad 120 through the first wiring 150a and the first connection pad 130a. The second connection structure 140b, between the two connection structures 140a and 140b, may be connected to the other corresponding chip connection pad 120 through the second wiring 150b and the second connection pad 130b. As illustrated in FIGS. 1, 2, and 6, the length of the first wiring 150a with the first outer layer circuit a1 may be shorter than the length of the second wiring 150b with the second outer layer circuit b1. In this case, the one chip connection pad 120 that is connected to the first wiring 150a may be bonded to the second chip pad 220b with a larger surface area between the first and second chip pads 220a and 220b. The other chip connection pad 120 that is connected to the second wiring 150b may be bonded to the first chip pad 220a with a smaller surface area between the first and second chip pads 220a and 220b.

Between the first and second wirings 150a and 150b that are connected to the first and second connection structures 140a and 140b, respectively, the first wiring 150a with a shorter length may exhibit a relatively small package parasitic capacitance on a signal path compared to the second wiring 150b. In this case, the chip connection pad 120 that is connected to the first wiring 150a may be bonded to the second chip pad 220b with a relatively large surface area. Accordingly, the signal path from the chip connection pad 120 to the internal integrated circuit through the second chip pad 220b may have a relatively large pad parasitic capacitance. As a result, the signal path from the first connection structure 140a to the internal integrated circuit through the first connection pad 130a, the first wiring 150a, the chip connection pad 120, and the second chip pad 220b may have a relatively small package parasitic capacitance and a relatively large pad parasitic capacitance.

Meanwhile, between the first and second wirings 150a and 150b, the second wiring 150b with a longer length may exhibit a relatively large package parasitic capacitance on the signal path, compared to the first wiring 150a. In this case, the other chip connection pad 120 that is connected to the second wiring 150b may be bonded to the first chip pad 220a with a relatively small surface area. Accordingly, the signal path from the other chip connection pad 120 to the internal integrated circuit through the first chip pad 220a may have a relatively small pad parasitic capacitance. As a result, the signal path from the second connection structure 140b to the internal integrated circuit through the second connection pad 130b, the second wiring 150b, the other chip connection pad 120, and the first chip pad 220a may have a relatively large package parasitic capacitance and a relatively small pad parasitic capacitance.

Through the above-described method, the chip connection pads 120 of the package substrate 10, respectively connected to the plurality of connection structures 140, may be bonded to the chip pad units 220 of the semiconductor chip 10. In an embodiment of the present disclosure, the difference in package parasitic capacitance that is generated in the package substrate 10 due to the difference in wiring length between the plurality of wirings 150 may be offset by using the difference in pad parasitic capacitance that is generated by the chip pads with different sizes in the semiconductor chip 20. In other words, the deviation of the sum of the package parasitic capacitance and the pad parasitic capacitance that is generated in each of the plurality of signal paths passing through the plurality of chip connection pads 120 of the semiconductor package may be reduced.

As a result, in the signal transfer path from each of the plurality of connection structures of the package substrate to the internal integrated circuit of the semiconductor chip through the corresponding chip connection pad and the chip pad of the semiconductor chip, the deviation of the sum of the parasitic capacitances that are generated in the signal transfer path for each of the plurality of connection structures may be reduced. As a result, it is possible to improve the electrical reliability of the semiconductor package by reducing the deviation in the transfer characteristics of the electrical signal generated for each of the plurality of connection structures.

Figure 7:
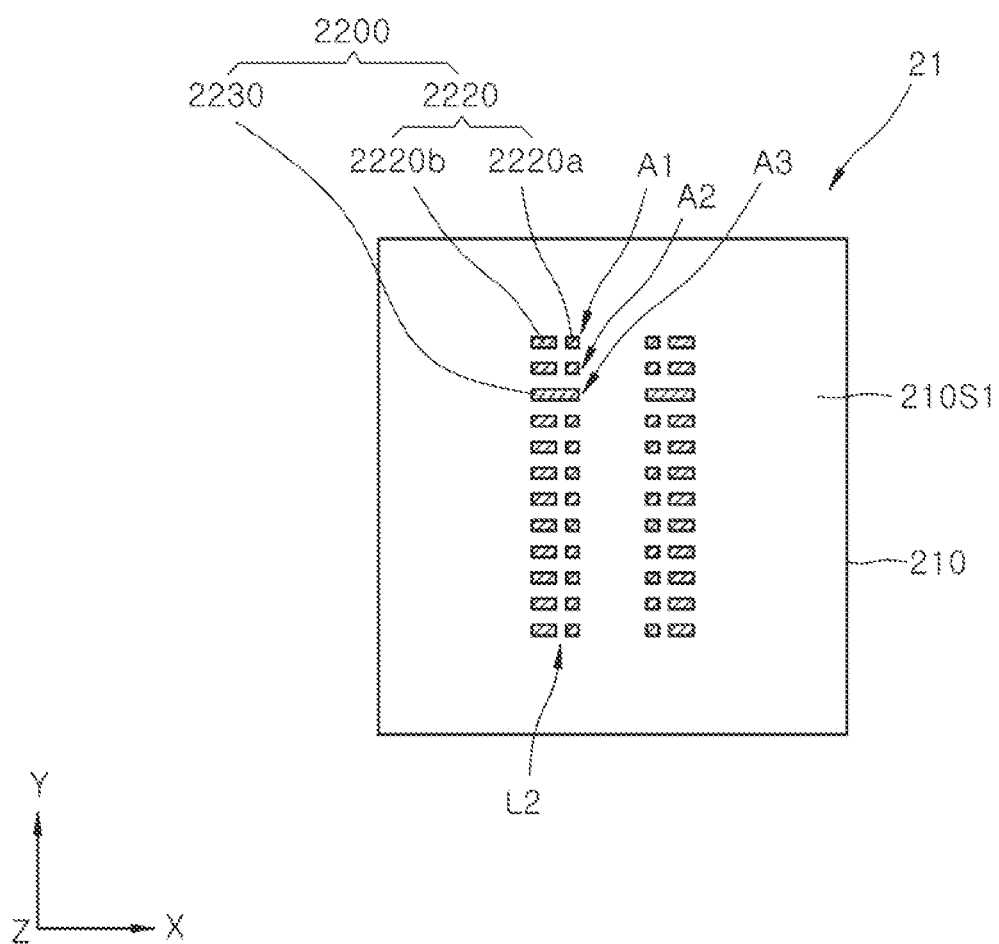
FIG. 7 is a plan view schematically illustrating a semiconductor chip according to another embodiment of the present disclosure.
Figure 8:
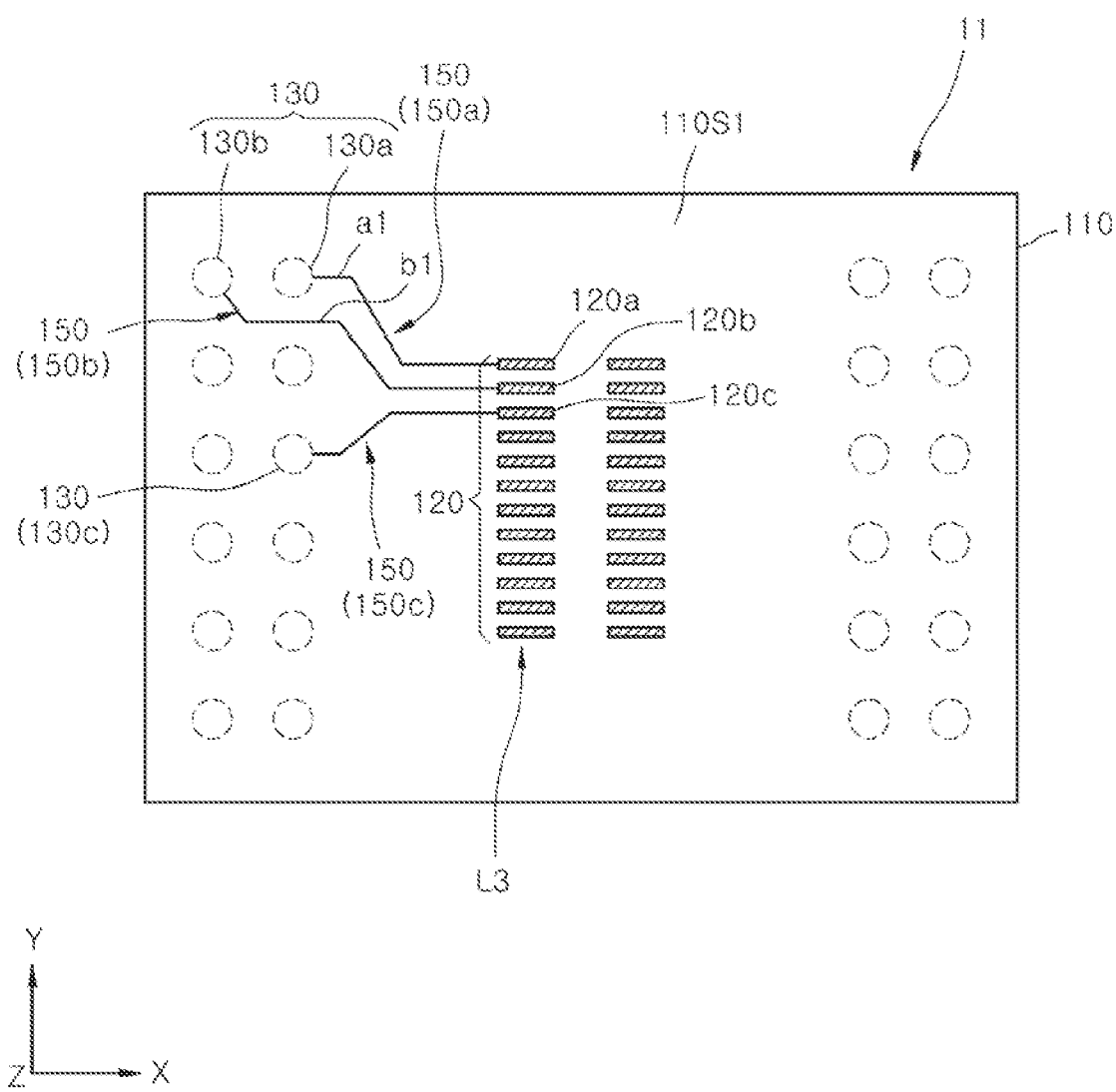
FIG. 8 is a plan view schematically illustrating a package substrate bonded to the semiconductor chip of FIG. 7 in another embodiment of the present application.
Figure 9:
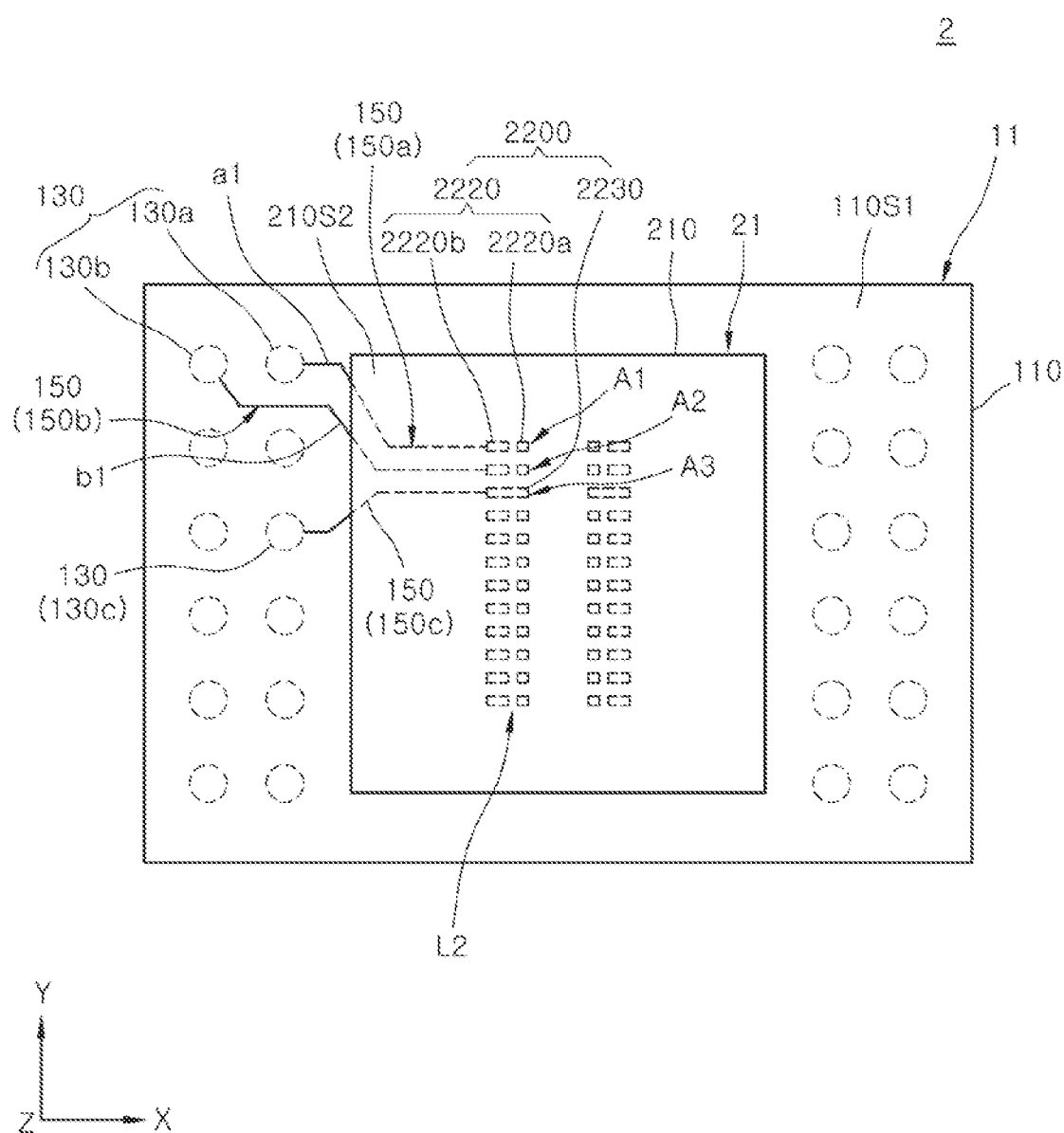
FIG. 9 is a plan view of a semiconductor package according to another embodiment of the present disclosure.

FIG. 7 is a plan view schematically illustrating a semiconductor chip according to another embodiment of the present disclosure. FIG. 8 is a plan view schematically illustrating a package substrate bonded to the semiconductor chip of FIG. 7 in another embodiment of the present disclosure. FIG. 9 is a plan view of a semiconductor package according to another embodiment of the present disclosure. More specifically, the semiconductor package 2 may be a package in which the semiconductor chip 21 of FIG. 7 is mounted on a package substrate 11 of FIG. 8.

Referring to FIGS. 7, 8, and 9, the semiconductor package 2 may be differentiated from the semiconductor package 1 described above in connection with FIGS. 1 to 6 in a configuration of the semiconductor chip 21. More specifically, the configuration of a chip pad structure 2200 of the semiconductor chip 21, illustrated in FIG. 7, may be different from the configuration of the chip pad units 220 of the semiconductor chip 20, described above with reference to FIG. 3. The chip pad structure 2200 of FIG. 7 may include a plurality of input/output pad units 2220 and at least one control pad unit 2230 that are disposed on a surface 210S1 of a chip body 210.

The plurality of input/output pad units 2220 and the at least one control pad unit 2230 may be disposed to be spaced apart from each other along the third direction (e.g., y-direction). In an embodiment, the plurality of input/output pad units 2220 and the at least one control pad unit 2230 may be disposed to form columns L2. In addition, in an embodiment, the plurality of input/output pad units 2220 and the at least one control pad unit 2230 may be arranged in two columns L2 parallel to each other in the y-direction. Although one control pad unit 2230 is illustrated in FIG. 7, the present disclosure is not limited thereto, and two or more control pad units 2230 may be disposed.

The configuration of the plurality of input/output pad units 2220 may be substantially the same as that of the plurality of chip pad units 220 of the semiconductor chip 20 described above with reference to FIG. 3. Each of the plurality of input/output pad units 2220 may include first and second chip pads 2220a and 2220b that are disposed to be spaced apart from each other in the x-direction. In this case, first chip pad 2220a may have a different surface area compared to the second chip pad 2220b. In an embodiment, as illustrated in FIG. 7, the first chip pad 2220a may have a smaller surface area than the second chip pad 2220b. The plurality of first chip pads 2220a may be arranged in one column along the y-direction. The plurality of second chip pads 2220b may also be spaced apart from the plurality of first chip pads 2220a to form one column along the y-direction. On the other hand, the at least one control pad unit 2230 may be an integral pad that is not separated from each other.

Referring to FIG. 8, the configuration of the package substrate 11 may be substantially the same as that of the package substrate 10 that is described above in connection with FIGS. 1 and 2. A plurality of chip connection pads 120 may be disposed on an upper surface 110S1 of the substrate body 110. The plurality of chip connection pads 120 may be arranged to form a column L3 along the third direction (e.g., y-direction). In an embodiment, the plurality of chip connection pads 120 may be arranged in two columns L3, parallel to each other in the y-direction. Referring to FIGS. 1 and 8 together, a plurality of connection pads 130 may be disposed on a lower surface 110S2 of the substrate body 110. Similarly, referring to FIGS. 1 and 8 together, the connection structures 140 of FIG. 1 may be disposed on the corresponding connection pads 130.

Referring to FIGS. 1 and 8 together, in an embodiment, a first connection structure 140a may be electrically connected to a corresponding first chip connection pad 120a among the plurality of chip connection pads 120 through a first wiring 150a via a first connection pad 130a. A second connection structure 140b may be electrically connected to a corresponding second chip connection pad 120b among the plurality of chip connection pads 120 through a second wiring 150b via a second connection pad 130b. A third connection structure (not illustrated) that is disposed on a third connection pad 130c may be electrically connected to a corresponding third chip connection pad 120c among the plurality of chip connection pads 120 through a third wiring 150c.

In an embodiment, the first chip connection pad 120a may be disposed to correspond to the input/output pad unit 2220 positioned in the row A1 in FIG. 7. The second chip connection pad 120b may be disposed to correspond to the input/output pad unit 2220 positioned in the row A2 of FIG.

7. The third chip connection pad 120c may be disposed to correspond to the control pad unit 2230 positioned in the row A3 of FIG. 7.

In the semiconductor package 2 of FIG. 9, the chip pad structures 2200 of the semiconductor chip 21 of FIG. 7 and the plurality of chip connection pads 120 of the package substrate 11 of FIG. 8 may be disposed to face each other in the z-direction. In addition, the chip pad structures 2200 of the semiconductor chip 21 may be disposed to overlap with the plurality of chip connection pads 120 of the package substrate 11 in the z-direction.

Referring to FIG. 9, the first chip connection pad 120a of FIG. 8 may be electrically bonded to one of the first chip pad 2220a and the second chip pad 2220b of the input/output pad unit 2220 positioned in the row A1. The second chip connection pad 120b of FIG. 8 may be electrically bonded to one of the first chip pad 2220a and the second chip pad 2220b of the input/output pad unit 2220 positioned in the row A2. The third chip connection pad 120c of FIG. 8 may be electrically bonded to the control pad unit 2230 positioned in the row A3.

Meanwhile, when a control signal is input from an electronic device that is outside of the semiconductor package 2, the control signal may be input to the third connection pad 130c from the external electronic device through the third connection structure of the package substrate 11. The input control signal may be transferred to the control pad unit 2230 that is positioned in the row A3 of the semiconductor chip 21 via the third wiring 150c and the third chip connection pad 120c.

The control signal that is transferred to the control pad unit 2230 may be transferred to a chip pad selection circuit that is connected to the control pad unit 2230 inside the chip body 210. The chip pad selection circuit may electrically connect one of the first chip pad 2220a and the second chip pad 2220b of the input/output pad unit 2220 to a signal input/output circuit that is in the chip body 210 based on the control signal. Accordingly, the internal integrated circuit of the semiconductor chip 21 may be electrically connected to the one chip pad through the signal input/output circuit. A method of selecting the chip pad using the control signal transferred through the control pad unit 2230 will be described in more detail below using the chip pad selection circuit 245 of FIGS. 10 and 11.

In an embodiment, one control pad unit 2230 may commonly participate in an operation of connecting one of the first and second chip pads 2220a and 2220b to the signal input/output circuit in each of at least two input/output pad units 2220. As an example, a control signal that is input to the control pad unit 2230 in row A3 may perform operations of determining chip pads to be connected to the signal input/output circuit 201 in the input/output pad unit 2220 that is positioned in row A1 and in the input/output pad unit 2220 that is positioned in row A2 together. As another example, a control signal that is input to the control pad unit 2230 in row A3 may perform operations of determining chip pads to be connected to the signal input/output circuits 201 in each of the input/output pad units 2220 that are disposed in the single column L2 together.

Figure 10:
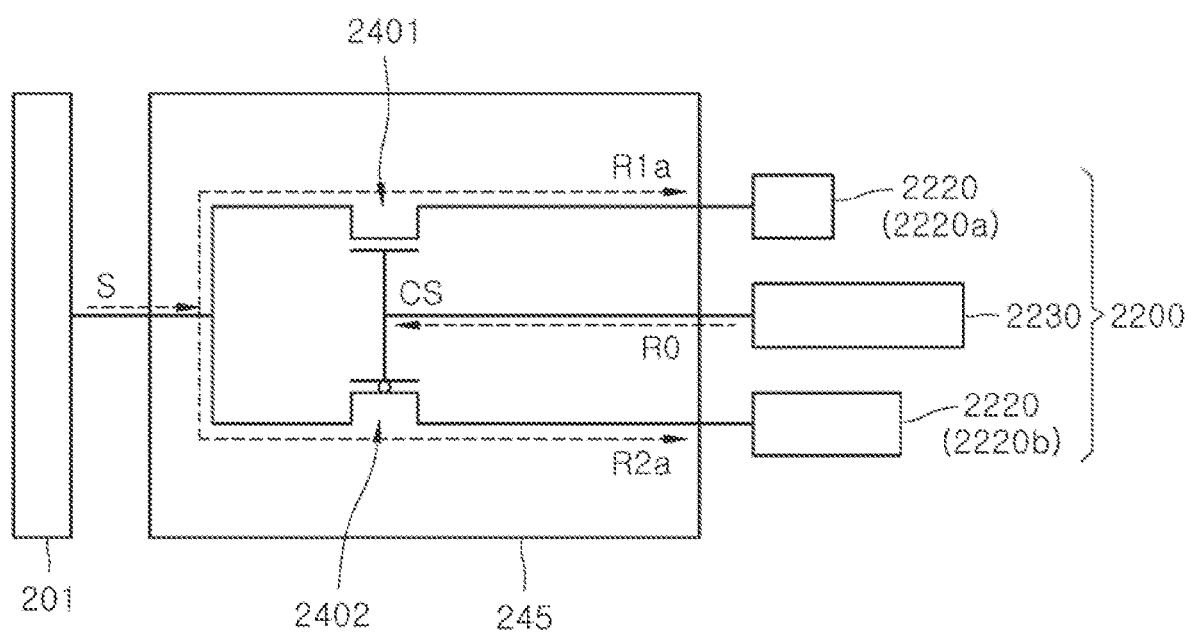
FIG. 10 is a circuit diagram schematically illustrating a chip pad selection circuit of a semiconductor chip according to an embodiment of the present disclosure.
Figure 11:
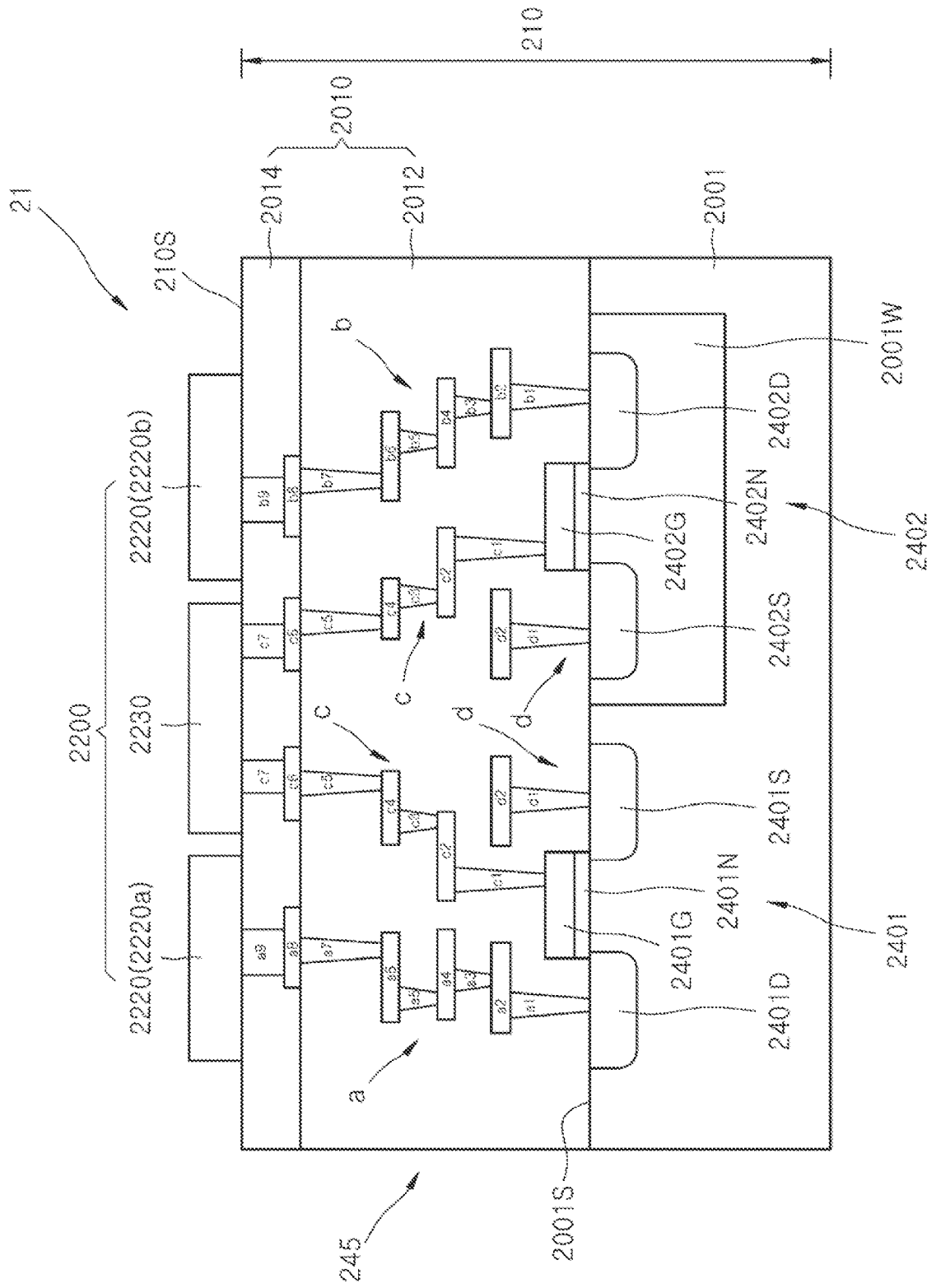
FIG. 11 is a schematic cross-sectional view of a semiconductor chip including a chip pad selection circuit according to an embodiment of the present disclosure.

FIG. 10 is a circuit diagram schematically illustrating a chip pad selection circuit of a semiconductor chip according to an embodiment of the present disclosure. FIG. 11 is a cross-sectional view schematically illustrating a semiconductor package with the chip pad selection circuit according to an embodiment of the present disclosure. The cross-sectional view of FIG. 11 may be a schematic view of the circuit of FIG. 10 implemented in a semiconductor chip. In addition, the semiconductor chip 21 with the chip pad selection circuit 245 of FIGS. 10 and 11 may be applied to the semiconductor package 2 of FIGS. 7 and 9. The chip pad selection circuit 245 may be disposed in the chip body 210 of the semiconductor chip 21 of FIG. 7.

Referring to FIGS. 10 and 11, the chip pad selection circuit 245 may be connected to a signal input/output circuit 201 in the chip body 210 and a chip pad connection structure 2200 that are disposed on a surface 210S1 of the chip body 210. The chip pad selection circuit 245 may be disposed in the chip body 210. The chip pad selection circuit 245 may be disposed to correspond to each of the plurality of input/output pad units 2220 of FIG. 7.

The chip pad selection circuit 245 may be configured to select one of a first chip pad 2220a and a second chip pad 2220b of the input/output pad unit 2220 and electrically connect the selected chip pad to the signal input/output circuit 201. As an example, the chip pad selection circuit 245 may electrically connect one of the first and second chip pads 2220a and 2220b to the signal input/output circuit 201 and electrically open the other one of the first and second chip pads 2220a and 2220b from the signal input/output circuit 201. Although not illustrated, the signal input/output circuit 201 may be electrically connected to an internal integrated circuit disposed in the chip body 210.

In an embodiment, when an electrical operation test is performed on the internal integrated circuit of the semiconductor chip 21, the chip pad selection circuit 245 may provide one of the first and second chip pads 2220a and 2220b as a chip test pad through the electrical connection. In addition, when the semiconductor chip 21 is mounted on the package substrate 11, the chip pad selection circuit 245 may provide the other one of the first and second chip pads 2220a and 2220b as a bonding pad for bonding the package substrate 11 to the package substrate 11.

An operation method of the chip pad selection circuit 245 will be schematically described with reference to FIG. 10. First, signal information S may be transferred from the signal input/output circuit 201 electrically connected to the internal integrated circuit to source terminals of first and second switching transistors 2401 and 2402. As an example, the first switching transistor 2401 may be an n-channel field effect transistor (NMOS FET), and the second switching transistor 2402 may be a p-channel field effect transistor (PMOS FET).

In this case, a control signal CS may be input to the semiconductor chip 21 from the control pad unit 2230 of the chip pad structure 2200. The control signal CS may be transferred to the control pad unit 2230 from an external electronic device that is connected to the semiconductor package 2 through the package substrate 11. When the control signal CS is a signal of "high" level, the first switching transistor 2401 may be turned-on, and signal information S may be output to the first chip pad 2220a via a first signal path R1a. In this case, the second switching transistor 2402 may maintain a turned-off state. In addition, when the control signal CS is a signal of "high" level, the signal information S that is input to the first chip pad 2220a may be input to the signal input/output circuit 201 via the turned-on first switching transistor 2401.

Meanwhile, the control signal CS is a signal of "low" level, the second switching transistor may be turned-on, and the signal information S may be output to the second chip pad 2220b via a second signal path R2a. In this case, the first switching transistor 2401 may maintain a turned-off state. In addition, when the control signal CS is a signal of "low" level, the signal information S that is input to the second chip pad 2220*b* may be input to the signal input/output circuit 201 via the turned-on second switching transistor 2402.

Referring to FIG. 10 again, one of the first and second chip pads 2220*a* and 2220*b* may be determined as a chip test pad. Before the semiconductor chip 21 is mounted on the package substrate 11, a test process for the internal integrated circuit of the semiconductor chip 21 may be performed. The chip test pad may function as a connection pad that is provided for a test device to electrically access the internal integrated circuit of the semiconductor chip 21 during the test process. In this case, the test device may also be connected to the control pad unit 2230. The test device may determine the chip test pad between the first and second chip pads 2220*a* and 2220*b* by inputting the control signal CS to the control pad unit 2230.

Furthermore, the other one of the first and second chip pads 2220*a* and 2220*b* may be determined as a bonding pad. After the test process for the internal integrated circuit is completed, the semiconductor chip 21 may be mounted on the package substrate 11. At this time, the bonding pad between the first and second chip pads 2220*a* and 2220*b* may be bonded to the corresponding chip connection pad 120 on the upper surface 110S1 of the substrate body 110 as described with reference to FIG. 9.

After the semiconductor chip 21 is electrically connected to the package substrate 11 through the bonding pad, the control signal CS may be provided from an electric device positioned outside the semiconductor package 2. In an embodiment, as described with reference to FIG. 9, the control signal CS may be input from the electric device to the third connection structure of the package substrate 11, and the input control signal CS may reach the control pad unit 2230 of the semiconductor chip 21 via the third connection pad 130*c*, the third wiring 150*c*, and the third chip connection pad 120*c*. The control signal CS that is input from the electric device to the control pad unit 2230 may determine the bonding pad between the first and second chip pads 2220*a* and 2220*b*. The bonding pad may be a chip pad other than the chip test pad that is connected to the test device when a test process for the internal integrated circuit is performed.

FIG. 11 is a cross-sectional view schematically illustrating a semiconductor structure with a chip pad selection circuit 245 of a semiconductor chip 21. The semiconductor structure may include a chip body 210 and a chip pad structure 2200. The chip pad structure 2200 may be disposed on a surface 210S1 of the chip body 210. The chip pad structure 2200 may include an input/output pad unit 2220 and a control pad unit 2230. The input/output pad unit 2220 may include a first chip pad 2220*a* and a second chip pad 2220*b* that are spaced apart from each other.

The chip body 210 may include a chip substrate 2001 and an insulating structure 2010 that is stacked on the chip substrate 2001. The insulating structure 2010 may include an internal insulating layer 2012 that is disposed on an upper surface 2001S of the chip substrate 2001 and a passivation layer 2014 that is disposed on the internal insulating layer 2012. The chip body 210 may include a wiring structure that is disposed in the insulating structure 2010. The wiring structure may include first to fourth chip wirings 'a', 'b', 'c', and 'd'.

The chip substrate 2001 may be a semiconductor substrate. In an embodiment, the chip substrate 2001 may be doped with a p-type dopant. The chip substrate 2001 may include an N-well region 2001W that is doped with an n-type dopant as opposed to p-type. In this case, a plurality of field effect transistors may be disposed on the chip substrate 2001. The plurality of field effect transistors may include first and second switching transistors 2401 and 2402 with different electrical channel types. As an example, the first switching transistor 2401 may be an n-channel field effect transistor, and the second switching transistor 2402 may be a p-channel field effect transistor.

The first switching transistor 2401 may include a source region 2401S and a drain region 2401D that are doped with an n-type dopant and spaced apart from each other. The first switching transistor 2401 may include a gate dielectric layer 2401N and a gate electrode layer 2401G that are disposed on the chip substrate 2001 between the source region 2401S and the drain region 2401D. Meanwhile, the second switching transistor 2402 may include a source region 2402S and a drain region 2402D that are doped with a p-type dopant and spaced apart from each other in the N-well region 2001W. The second switching transistor 2402 may include a gate dielectric layer 2402N and a gate electrode layer 2402G that are disposed on the chip substrate 2001 between the source region 2402S and the drain region 2402D.

Referring to FIG. 11, the drain region 2401D of the first switching transistor 2401 may be electrically connected to the first chip pad 2220*a* of the input/output pad unit 2220 through the first chip wiring a. The first chip wiring 'a' may include a first circuit layer a2, a second circuit layer a4, a third circuit layer a6, and a fourth circuit layer a8. In addition, the first chip wiring 'a' may include a first contact plug a1 that connects the drain 2401D and the first circuit layer a2 to each other, a first contact via a3 that connects the first and second circuit layers a2 and a4 to each other, a second contact via a5 that connects the second and third circuit layers a4 and a6 to each other, a third contact via a7 that connects the third and fourth circuit layers a6 and a8 to each other, and a redistribution line a9 that connects the fourth circuit layer a8 and the first chip pad 2220*a* to each other. The redistribution line a9 may be disposed in the passivation layer 2014. The remaining first chip wiring 'a', except for the redistribution line a9, may be disposed in the internal insulating layer 2012.

The drain region 2402D of the second switching transistor 2402 may be electrically connected to the second chip pad 2220*b* of the input/output pad unit 2220 through the second chip wiring 'b'. The second chip wiring 'b' may include a first circuit layer b2, a second circuit layer b4, a third circuit layer b6, and a fourth circuit layer b8. In addition, the second chip wiring b may include a first contact plug b1 that connects the drain 2402D and the first circuit layer b2 to each other, a first contact via b3 that connects the first and second circuit layers b2 and b4 to each other, a second contact via b5 that connects the second and third circuit layers b4 and b6 to each other, a third contact via b7 that connects the third and fourth circuit layers b6 and b8 to each other, and a redistribution line b9 that connects the fourth circuit layer b8 and the second chip pad 2220*b* to each other. The redistribution line b9 may be disposed in the passivation layer 2014. The remaining second chip wiring 'b', except for the redistribution line b9, may be disposed in the internal insulating layer 2012.

Meanwhile, the gate electrode layers 2401G and 2402G of the first and second switching transistors 2401 and 2402, respectively, may be electrically connected to the control pad unit 2230 through the third chip wirings 'c'. That is, the control pad unit 2230 may be commonly connected to the gate electrode layers 2401G and 2402G of the first and second switching transistors 2401 and 2402, respectively. Each of the third chip wirings c may include a first circuit layer c2, a second circuit layer c4, and a third circuit layer c6. In addition, the third chip wirings c may include contact plugs c1 that connect the gate electrode layers 2401G and the 2402G of the first and second switching transistors 2401 and 2402 to the first circuit layer c2, first contact vias c3 that connect the first and second circuit layers c2 and c4 to each other, second contact vias c5 that connect the second and third circuit layers c4 and c6 to each other, and redistribution lines c7 that connect the third circuit layer c6 and the control pad unit 2230 to each other. The redistribution lines c7 may be disposed in the passivation layer 2014. The remaining third chip wirings 'c', except for the redistribution lines c7, may be disposed in the internal insulating layer 2012.

Meanwhile, the source regions 2401S and 2402S of the first and second switching transistors 2401 and 2402, respectively, may be electrically connected to a signal input/output circuit (not illustrated) through the fourth chip wirings 'd'. The signal input/output circuit may be commonly connected to the source regions 2401S and 2402S of the first and second switching transistors 2401 and 2402, respectively. The signal input/output circuit may correspond to the signal input/output circuit 201 in the circuit diagram of FIG. 10.

The fourth chip wirings 'd' may include first circuit layers d2 and contact plugs d1 that connect the first circuit layers d2 and the source regions 2401S and 2402S to each other. Although not illustrated in FIG. 10, the signal input/output circuit may include a logic circuit with a plurality of switching transistors that are disposed on the chip substrate 2001. Accordingly, the first circuit layers d2 may be electrically connected to the plurality of switching transistors that are disposed on the chip substrate 2001 through other contact plugs (not illustrated). The fourth chip wirings 'd' may be disposed in the inner insulating layer 2012.

As described above, the chip pad structure 2200 that is disposed on the surface 210S of the chip body 210 may be electrically connected to the first and second switching transistors 2401 and 2402 that are disposed in the chip substrate 2001 through the first to fourth chip wirings 'a', 'b', 'c', and 'd'. Based on a control signal that is input to the control pad unit 2230, one of the first and second switching transistors 2401 and 2402 may be turned-on, so that the signal input/output circuit may be electrically connected to one of the first and second chip pads 2220a and 2220b.

Meanwhile, in the embodiment described in connection with FIGS. 7 to 11, a method for the chip selection pad circuit 245 to determine the chip test pad and the bonding pad from the first and second chip pads 220a and 220b based on the control signal CS may be substantially the same as the method described above in connection with FIGS. 1, 2, 3, and 6. That is, by adopting the method of reducing the parasitic capacitance deviation for each wiring in the semiconductor package, one of the first and second chip pads 220a and 220b may be first determined as a bonding pad, and then, the other may be determined as a chip test pad.

More specifically, referring to FIGS. 7 to 9 together, the method of determining the bonding pad may employ the following method. A pair of first and second chip connection pads 120a and 120b and a pair of first and second connection pads 130a and 130b may be selected from the package substrate 21. The first and second wirings 150a and 150b may connect the first and second chip connection pads 120a and 120b to the first and second connection pads 130a and 130b, respectively. In this case, when the length of the second wiring 150b is relatively long, the second chip connection pad 120b may be determined to be bonded to the first chip pad 2220a with a relatively small surface area between the first and second chip pads 2220a and 2220b that are positioned in the row A2 of the semiconductor chip 21. That is, in the input/output pad unit 2220 that is positioned in row A2, the first chip pad 2220a may be determined as a bonding pad to be bonded to the second chip connection pad 120b, and the second chip pad 2220b may be determined as a chip test pad. Meanwhile, when the length of the first wiring 150a is relatively short, the first chip connection pad 120a may be determined to be bonded to the second chip pad 2220b with a relatively large surface area between the first and second chip pads 2220a and 2220b that are positioned in the row A1 of the semiconductor chip 21. That is, in the input/output pad unit 2220 that is positioned in row A1, the second chip pad 2220b may be determined as a bonding pad to be bonded to the first chip connection pad 120a, and the first chip pad 2220a may be determined as a chip test pad.

By applying substantially the same method as described above, the bonding pad of the semiconductor chip 21 to which the plurality of chip connection pads 120 that are disposed on the package substrate 11 are bonded may be determined. In addition, the chip test pad for testing the internal integrated circuit of the semiconductor chip 21 may be determined.

The present teachings have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather an illustrative standpoint. The scope of the present teachings is not limited to the above descriptions but defined by the accompanying claims, and all of distinctive features in the equivalent scope should be construed as being included in the inventive concept.

What is claimed is:

1. A semiconductor chip comprising:
   a chip body including a signal input/output circuit;
   a chip pad structure disposed on a surface of the chip body, the chip pad structure including an input/output pad unit and a control pad unit; and
   a chip pad selection circuit disposed in the chip body and electrically connected to the signal input/output circuit and the chip pad structure,
   wherein the input/output pad unit includes first and second chip pads, the first and second chip pads having different surface areas, and
   wherein the chip pad selection circuit is configured to select one of the first and second chip pads and configured to electrically connect the selected pad to the signal input/output circuit based on a control signal that is input from the control pad unit,
   wherein the chip body comprises:
   a chip substrate;
   a plurality of field effect transistors disposed in the chip substrate;
   an insulating structure disposed on the chip substrate and disposed between the plurality of field effect transistors and the chip pad structures; and
   a wiring structure disposed in the insulating structure,
   wherein the chip pad structure is electrically connected to the plurality of field effect transistors through the wiring structure,
   wherein the wiring structure comprises:
   a plurality of circuit layers disposed to be spaced apart from each other in a direction that is perpendicular to a surface of the chip substrate;
   a contact plug electrically connecting a lowermost layer of the plurality of circuit layers to the chip substrate;

a contact via connecting the plurality of circuit layers to each other; and a redistribution line electrically connecting an uppermost layer of the plurality of circuit layers to the chip pad structure.

2. The semiconductor chip of claim 1, wherein the chip pad selection circuit is further configured to electrically open the other chip pad that is not selected from the signal input/output circuit.

3. The semiconductor chip of claim 1, wherein each of the first and second chip pads has a surface area with a pad parasitic capacitance that is proportional to the surface area.

4. The semiconductor chip of claim 1, wherein the plurality of field effect transistors comprise first and second switching transistors with different electrical channel types from each other.

5. The semiconductor chip of claim 4, wherein one of the first and second switching transistors is an n-channel field effect transistor and the other transistor is a p-channel field effect transistor.

6. The semiconductor chip of claim 4,
wherein the wiring structure includes first to fourth chip wirings, and
wherein the first chip wiring electrically connects a drain region of the first switching transistor to the first chip pad,
the second chip wiring electrically connects a drain region of the second switching transistor to the second chip pad,
the third chip wiring electrically connects a gate electrode layer of each of the first and second switching transistors to the control pad unit, and
the fourth chip wiring electrically connects a source region of each of the first and second switching transistors to the signal input/output circuit.

7. A semiconductor package comprising:
a package substrate; and
a semiconductor chip disposed on the package substrate,
wherein the package substrate comprises:
a substrate body; and
a plurality of chip connection pads that are disposed on a surface of the substrate body,
wherein the semiconductor chip comprises:
a chip body; and
a chip pad structure disposed on a surface of the chip body, the chip pad structure including a plurality of input/output pad units and at least one control pad unit,
wherein the plurality of input/output pad units and the at least one control pad unit are disposed to respectively correspond to the plurality of chip connection pads,
wherein each of the plurality of input/output pad units comprises first and second chip pads that are disposed to be spaced apart from each other, the first and second chip pads having different surface areas, and
wherein one chip pad of the first and second chip pads is electrically connected to the corresponding chip connection pad among the plurality of chip connection pads,
wherein the chip body comprises:
a chip substrate;
a plurality of field effect transistors disposed in the chip substrate;

an insulating structure disposed on the chip substrate, the insulating structure disposed between the plurality of field effect transistors and the chip pad structure; and
a wiring structure disposed in the insulating structure,
wherein the chip pad structure is electrically connected to the plurality of field effect transistors through the wiring structure,
wherein the wiring structure comprises: a plurality of circuit layers disposed to be spaced apart from each other in a direction that is perpendicular to a surface of the chip substrate; a contact plug electrically connecting a lowermost layer of the plurality of circuit layers to the chip substrate; a contact via connecting the plurality of circuit layers to each other; and a redistribution line electrically connecting an uppermost layer of the plurality of circuit layers to the chip pad structure.

8. The semiconductor package of claim 7, wherein the semiconductor chip further comprises:
a signal input/output circuit disposed in the chip body; and
a chip pad selection circuit connected to the signal input/output circuit and the chip pad structure, and
wherein the chip pad selection circuit is configured to electrically connect the one chip pad of the first and second chip pads to the signal input/output circuit based on a control signal that is input from the at least one control pad unit.

9. The semiconductor package of claim 8,
wherein, in the plurality of input/output pad units, one chip pad of the first and second chip pads is a bonding pad that is electrically connected to a corresponding chip connection pad among the plurality of chip connection pads, and the other chip pad of the first and second chip pads is a test pad that is provided to be connected to a test device for testing an internal integrated circuit of the semiconductor chip.

10. The semiconductor package of claim 9, wherein the signal input/output circuit is electrically connected to the chip connection pad through the bonding pad.

11. The semiconductor package of claim 7, wherein the plurality of field effect transistors comprise first and second switching transistors, the first and second switching transistors having different electrical channel types, and
wherein one switching transistor of the first and second switching transistors is an n-channel field effect transistor, and the other switching transistor is a p-channel field effect transistor.

12. The semiconductor package of claim 11,
wherein the wiring structure comprises first to fourth chip wirings,
wherein the first chip wiring electrically connects a drain region of the first switching transistor to the first chip pad of a corresponding input/output pad unit among the plurality of input/output pad units,
wherein the second chip wiring electrically connects a drain region of the second switching transistor to the second chip pad of input/output pad unit among the plurality of input/output pad units,
wherein the third chip wiring electrically connects a gate electrode layer of each of the first and second switching transistors to a corresponding control pad unit among the at least one control pad unit, and
wherein the fourth chip wiring electrically connects a source region of each of the first and second switching transistors to the signal input/output circuit.

13. The semiconductor package of claim 12, wherein the control signal that is input to the one control pad unit is configured to turn on one switching transistor of the first and second switching transistors.

14. The semiconductor package of claim 7, further comprising:
a plurality of connection pads that are disposed on the lower surface of the substrate body; and
a plurality of wirings electrically connecting the plurality of chip connection pads to the corresponding connection pads.

15. The semiconductor package of claim 14, further comprising first and second connection structures disposed on the first and second connection pads, respectively, among the plurality of connection pads,
wherein the first connection structure is electrically connected to the first chip connection pad through the first wiring, and the second connection structure is electrically connected to the second chip connection pad through the second wiring,
wherein a length of the first wiring is shorter than a length of the second wiring, and
wherein the first chip connection pad is electrically connected to a chip pad with a larger surface area between the first and second chip pads of a corresponding chip pad unit among a plurality of chip pad units, and the second chip connection pad is electrically connected to a chip pad with a smaller surface area between the first and second chip pads of a corresponding chip pad unit among the plurality of chip pad units.

16. The semiconductor package of claim 15, further comprising a third chip connection structure disposed on a third connection pad among the plurality of connection pads,
wherein the third chip connection structure is connected to the third chip connection pad, and
wherein the third chip connection pad is electrically connected to the at least one control pad unit of the semiconductor chip.

\* \* \* \* \*